United States Patent [19]
Mellen et al.

[11] Patent Number: 6,058,256
[45] Date of Patent: *May 2, 2000

[54] TECHNIQUE FOR EFFECTIVELY ROUTING CONDUCTION PATHS IN CIRCUIT LAYOUTS

[75] Inventors: Donald B. Mellen, Warren; Attilio Joseph Rainal, Morristown; Jack P. White, Parsippany, all of N.J.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/720,235

[22] Filed: Sep. 26, 1996

[51] Int. Cl.$^7$ ...................................... G06F 17/50
[52] U.S. Cl. ................ 395/500.13; 395/500.15; 395/500.14
[58] Field of Search ...................... 364/488–491; 324/628; 307/270; 395/500, 500.13, 500.14, 500.15

[56] References Cited

U.S. PATENT DOCUMENTS

| | | | |
|---|---|---|---|
| 5,304,856 | 4/1994 | Rainal | 327/108 |
| 5,481,695 | 1/1996 | Purks | 395/500 |
| 5,502,644 | 3/1996 | Hamilton et al. | 364/488 |
| 5,532,603 | 7/1996 | Bottman | 324/628 |
| 5,568,395 | 10/1996 | Huang | 364/489 |
| 5,841,664 | 11/1998 | Cai et al. | 364/490 |

FOREIGN PATENT DOCUMENTS

| | | |
|---|---|---|
| 3-3347 | 1/1991 | Japan . |
| 5-314220 | 11/1993 | Japan . |

OTHER PUBLICATIONS

Hameenanttila et al "Fast Coupled Noise Calculation for Crosstalk Avoidance in MCM Aotorouting," IEEE, pp. 11–14, Sep. 1995.
Rainal et al "Transmission Properties of Balanced Interconnections," IEEE, pp. 137–145, Feb. 1993.
A. J. Rainal "Eliminating Inductive Noise of External Chip Interconnections," IEEE, pp. 126–129, Feb. 1994.
Carothers et al "MCG: A Correct–by–Design Multichip Module Router with Crosstalk Avoidance, " IEEE, pp. 183–188.
Richard Goering, "CCT to Buy UniCAD for Analysis Lift," *Electronic Engineering Times*, pp. 1 & 16, Jul. 29, 1996.
Hameenantilla et al "Fast Coupled Noise Estimation for Crosstalk Avoidance in the MCG Multichip Module Autorouter," IEEE, pp. 356–368, Sep. 1996.
Thakur et al "An Optimal Layer Assignment Algorithm for Minimizing Crosstalk for Three Layer VHV Channel Routing," IEEE, Apr. 95, pp. 207–210.
Carothers et al "MCG: A Correct–by–Design Multichip Module Router with Crosstalk Avoidance," IEEE, Jun. 96, pp. 183–188.

(List continued on next page.)

*Primary Examiner*—Kevin J. Teska
*Assistant Examiner*—Vuthe Siek

[57] ABSTRACT

In a routing system where a router interconnects circuit components with conduction paths, a crosstalk analyzer is employed to audit the electrical crosstalk incurred in coupled path segments during the interconnection. The resulting crosstalk measures are compared with one or more acceptable crosstalk limits. If the measures exceed any limits, the unsatisfactory condition is fed back to the router, along with information on suggested re-arrangements of the segments. In response to this feedback, the router modifies the routed interconnections to reduce the crosstalk level.

15 Claims, 7 Drawing Sheets

OTHER PUBLICATIONS

Jhang et al "COP: A Crosstalk Optimizer for Gridded Channel Routing," IEEE, Apr. 96, pp. 424–429.

Jhang et al "A Segment Rearrangement Approach to Channel Routing Under the Crosstalk Constraints," IEEE, Dec. 94, pp. 536–541.

Onuzawa et al "Performance Driven Spacing Algorithms Using Attractive and Repulsive Constraints for Submicron LSI's" IEEE, Jun. 95, pp. 707–719.

Gao et al "Minimum Crosstalk Channel Routing," IEEE, May 96, pp. 465–474.

Miyoshi et al "An MCM Routing Algorithm Considering Crosstalk," IEEE, May 95, pp. 211–214.

Gao et al "Minimum Crosstalk Channel Routing," IEEE, pp. 692–696, 1993.

Peter M. Maurer "Automatic Routing of Integrated Circuit Connections: A Tutorial," IEEE, pp. 801–805, 1990.

TECHNIQUE FOR EFFECTIVELY ROUTING CONDUCTION PATHS IN CIRCUIT LAYOUTS

FIELD OF THE INVENTION

The invention relates to systems and methods for computer-aided design of electrical circuit layouts and, in particular, to a system and method for reducing electrical crosstalk in conduction paths in such layouts.

BACKGROUND OF THE INVENTION

In designing an electrical circuit layout, for example, on a multichip module (MCM), or printed wiring board (PWB), also known as printed circuit board (PCB), a major concern is excessive electric crosstalk incurred by the design of the layout. Crosstalk is unwanted noise passing between nearby conductors or transmission lines belonging to parts of the circuit that should be electrically isolated from each other. Beyond a tolerable level, crosstalk diminishes the quality and reliability and even destroys the functionality of the PWB or MCM, and the equipment in which it is installed. Two major causes of crosstalk are impedance mismatching and the too-close parallel coupling of conductors. In electrical applications including wireless applications which call for circuit miniaturization, the requirements of dense signal conductor routing, use of thin dielectric between layers, and high signal propagation speeds all compound the crosstalk problem.

General techniques for reducing crosstalk include using shielding conductors, spreading conductor paths by minimum distances, routing signals on additional layers, restricting parallelism, etc. However, such techniques usually incur a large layout area and additional shielding, thus undesirably increasing the product cost.

A particular technique for auditing and reducing crosstalk on a PCB circuit is disclosed in U.S. Pat. No. 5,502,644 issued Mar. 26, 1996 to Hamilton et al., which is hereby incorporated by reference. In accordance with the disclosed approach, after the PCB circuit is completely interconnected or routed by an interconnection router, crosstalk in electrical conductors in the circuit is audited or analyzed. In particular, the audit process defines conduction paths into conduction nets. These conduction nets are selected one at a time for a crosstalk analysis and simulated as an idle net carrying no voltage. Nearby conduction nets are simulated as driven nets carrying signals having a non-zero voltage. Crosstalk quantities are derived such as a coherent sum (CSUM), coherent/incoherent sum (CISUM), and incoherent sum (ISUM) for determining the crosstalk effect of the driven nets on the idle net. To reduce the crosstalk levels, conduction paths are manually edited by moving, shoving-aside and re-routing the paths. The corrected design is re-audited in accordance with the disclosed technique. This process continues until the crosstalk level in each net becomes acceptable. It is thus time consuming and labor intensive especially when the interconnection density is high, and a significant number of the nets have a crosstalk level above an acceptable limit.

Accordingly, it is desirable to have a methodology for efficiently rendering a layout of an electrical circuit, which is cost effective and well satisfies the crosstalk requirements.

SUMMARY OF THE INVENTION

The invention overcomes the prior art limitation by providing a feedback signal to the router for routing conduction paths in a circuit layout. While the router is rendering interconnections, the feedback signal is transmitted to the router to cause the latter to reconfigure the interconnections, if necessary. This signal represents information on, among other things, whether the level of crosstalk in the conduction paths of the interconnections exceeds an acceptable crosstalk limit. To that end, the conduction paths are audited for crosstalk in real-time. If the interconnections do not meet the crosstalk requirements, the information fed back to the router includes the unacceptable crosstalk condition. The information may also include suggestive modifications of the interconnections for reducing the crosstalk level. In response to the feedback signal, the router reconfigures the interconnections to meet the crosstalk requirements.

Advantageously, the end product of the inventive methodology is a complete circuit layout which is guaranteed to meet the crosstalk requirements without further modification of the layout, and use of circuit and field simulators during the layout of the circuit is avoided. Moreover, this methodology requires minimal use of costly crosstalk reduction techniques such as adding shielding or layers to the layout design.

DETAILED DESCRIPTION

Figure 1:
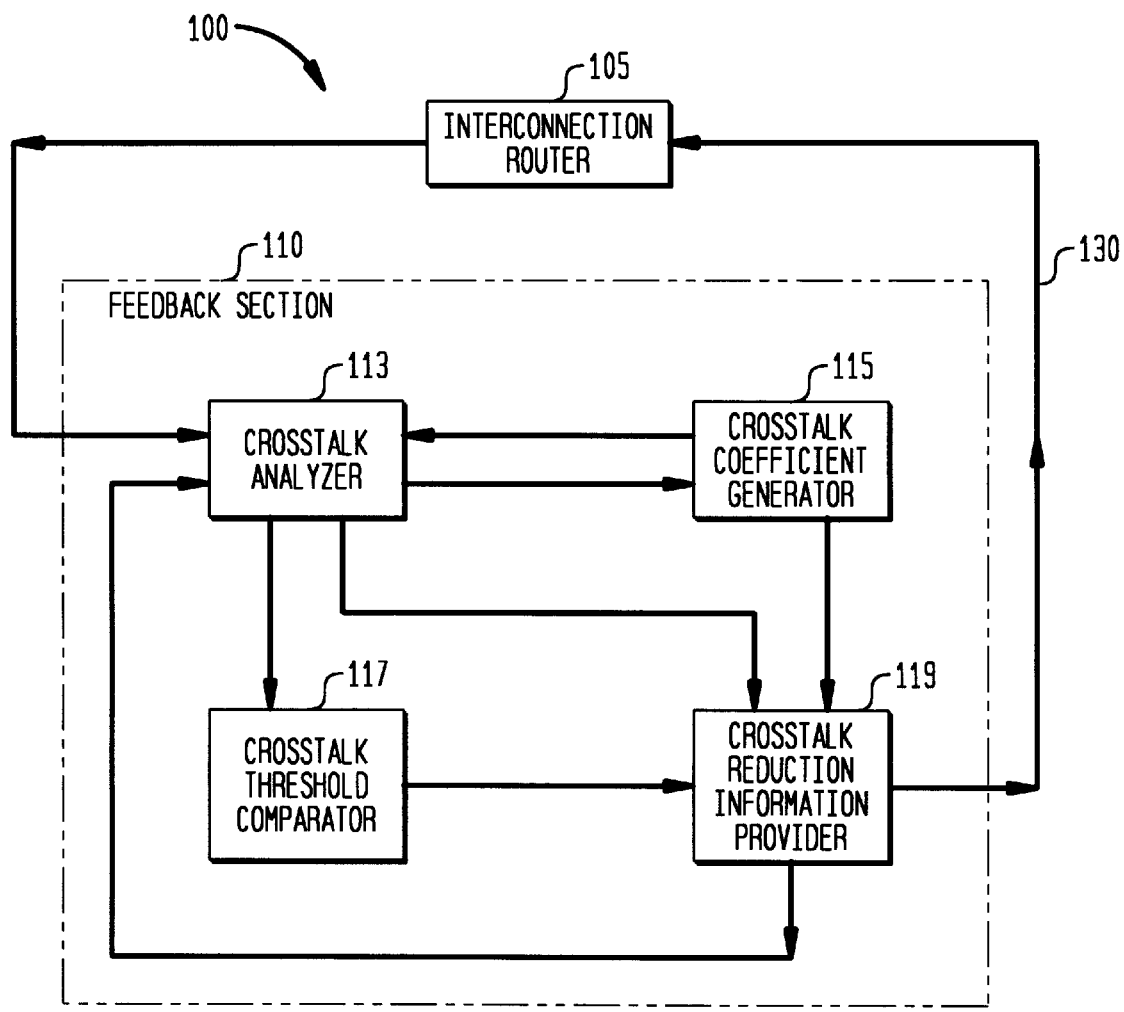
FIG. 1 is a block diagram of a routing system for interconnecting circuit components with conduction paths in accordance with the invention.

FIG. 1 illustrates routing system 100 embodying the principles of the invention. After the schematic of an electrical circuit is completed, electrical requirements including acceptable crosstalk limits are established, and circuit components are placed in final locations, routing system 100 is employed to interconnect the circuit components with conduction paths or transmission lines.

As shown in FIG. 1, system 100 comprises interconnection router 105 of conventional design, and feedback section 110 to be described. In accordance with the invention, during an interconnection of circuit components, router 105 routes the conduction paths in response to feedback signals from section 110. These feedback signals are generated in response to the results of a real-time crosstalk audit of the conduction paths. They also convey information to router 105 to help the latter modify the routing, if necessary, to satisfy the crosstalk requirements. Thus, in accordance with the invention, system 100 monitors and automatically reduces the level of crosstalk in conduction paths in a circuit layout during the routing thereof. The end product of system 100 is a final layout meeting the electrical crosstalk requirements. As such, system 100 is much different from the prior art system where the circuit must be completely interconnected before the interconnections are audited for crosstalk for the first time, and is subject to repeated, laborious modifications when the level of crosstalk exceeds a predetermined limit.

Figure 2:
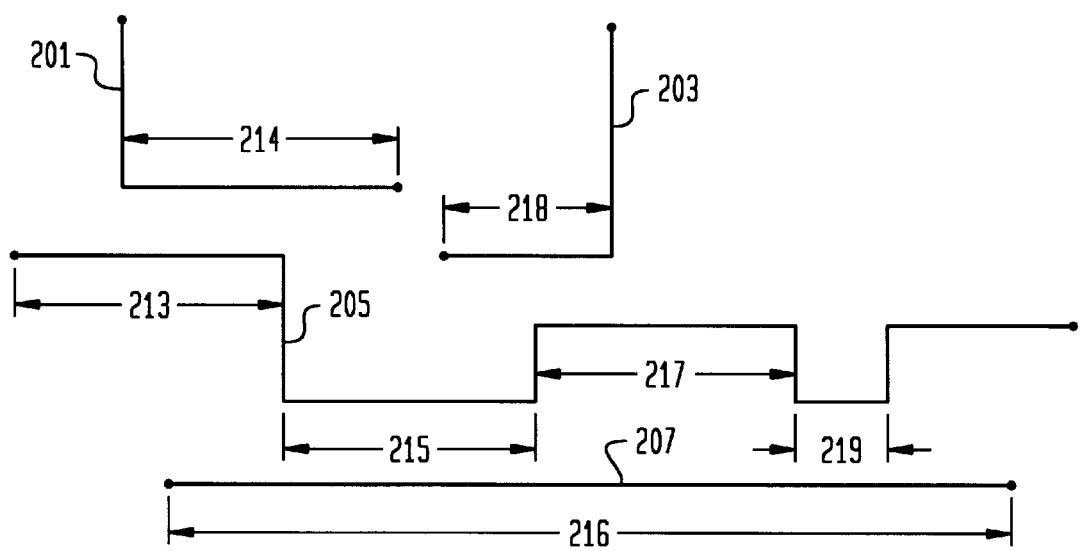
FIG. 2 illustrates interconnections routed by the routing system of FIG. 1.

In this illustrative embodiment, system 100 is used to route the connections on a subset by subset basis on a printed wiring board (PWB) including a number of layers. As shown in FIG. 1, feedback section 110 comprises crosstalk analyzer 113, crosstalk coefficient generator 115, crosstalk threshold comparator 117 and crosstalk reduction information provider 119. Crosstalk analyzer 113 audits the crosstalk of coupled path segments (defined below) in the subset of connections routed by router 105. FIG. 2 illustrates one such subset routed by router 105. This subset comprises conduction nets 201, 203, 205 and 207 which are disposed on one or many layers. As shown in FIG. 2, each conduction net includes individual path segments. For example, net 205 includes path segments 213, 215, 217, and 219.

Figure 3A:
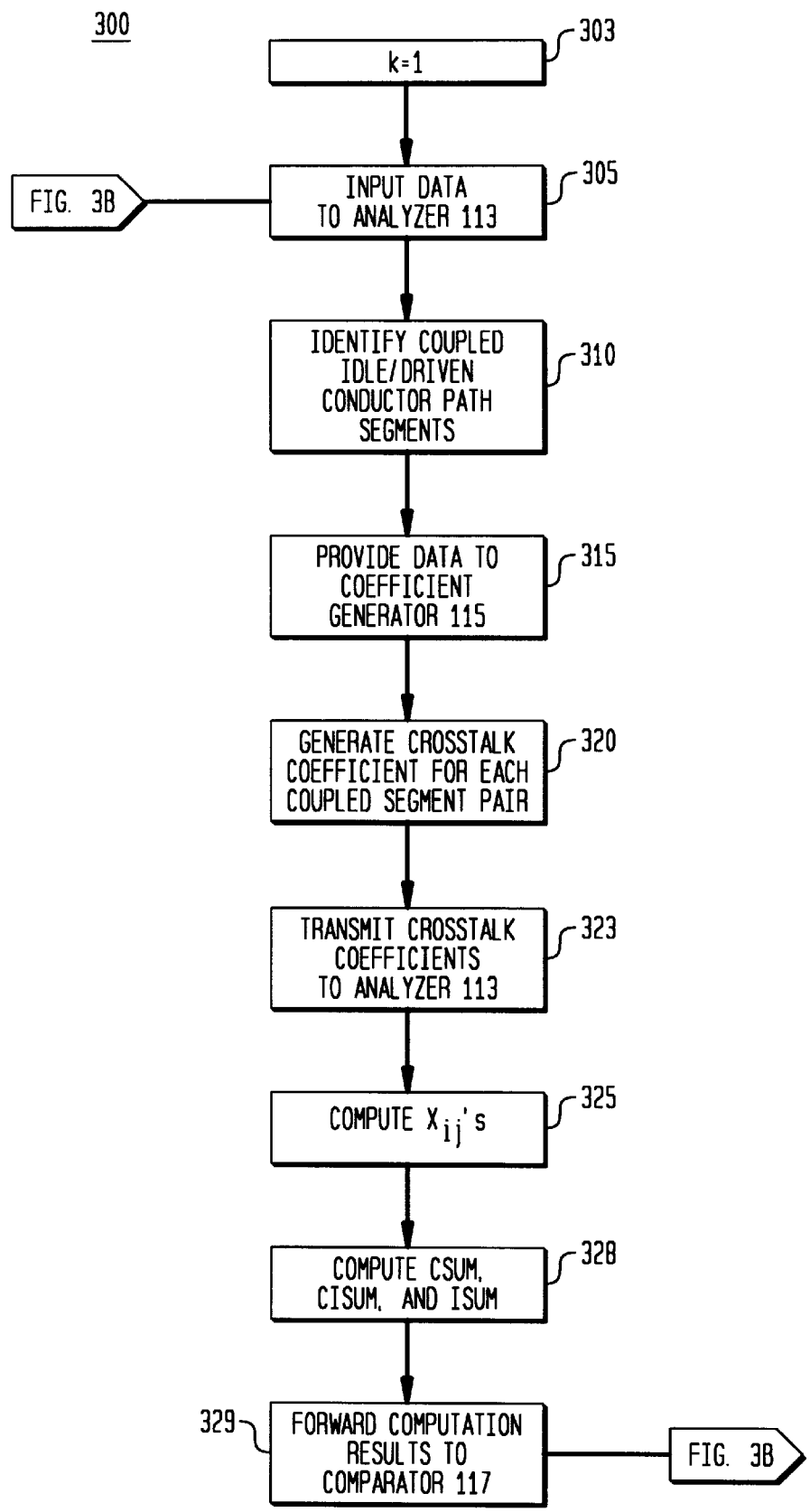
FIGS. 3A and 3B are flow charts jointly depicting the steps of a feedback operation in the routing system of FIG. 1.
Figure 3B:
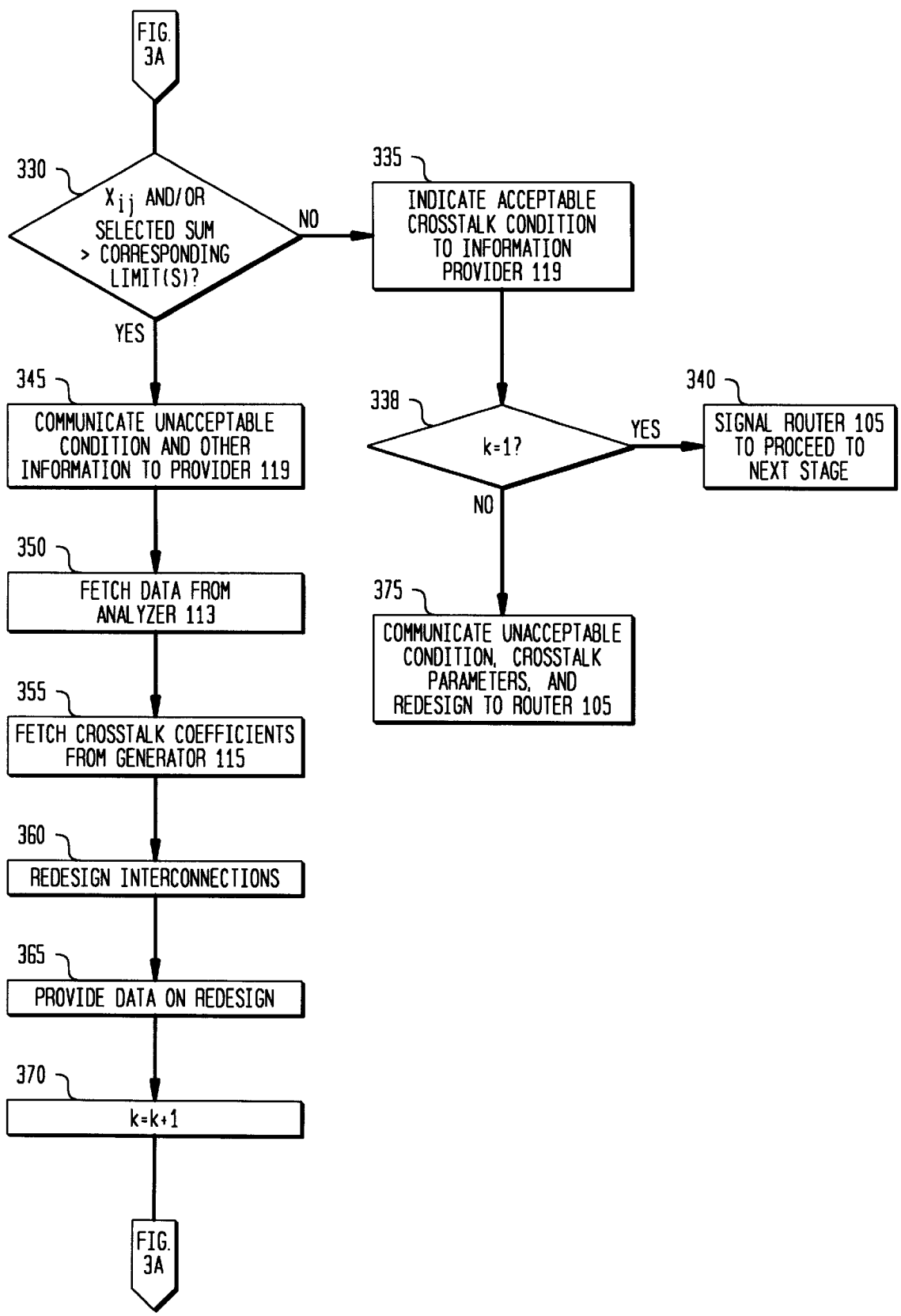

Feedback section 110 operates pursuant to process 300 illustrated in FIGS. 3A and 3B. After router 105 completes the interconnections of FIG. 2, it signals crosstalk analyzer 113 to start process 300. In response, analyzer 113 causes an initialization of an index k stored in crosstalk reduction information provider 119 by setting k=1, as indicated at step 303 in FIG. 3A. At step 305 analyzer 113 receives, as an input, conduction path data on each path segment being audited. This data initially comes from router 105. It provides the width of each path segment, and identifies the end points of the segment, and thus its physical location in the layout including the layer and conduction net to which the segment belongs. Also input to analyzer 113 are net electrical specifications associated with the respective nets in the subset being analyzed. These specifications are provided by a system user or otherwise. Each specification includes a net identification, and information on the net usage, net rise times, net frequencies, net voltage swing, net type (i.e., whether the net is used for conducting signals or power, or as ground), whether the net is a paired net, and whether the net is a bussed net.

During the crosstalk audit by analyzer 113, conduction nets 201, 203, 205 and 207 in FIG. 2 are selected one at a time, and simulated as an idle net carrying no voltage. Other conduction nets near the idle net are simulated as driven nets carrying signals having a non-zero voltage. Analyzer 113 derives crosstalk parameters measuring the crosstalk effect of the driven nets on the idle net.

Specifically, analyzer 113 identifies each pair of coupled idle/driven conductor path segments, as indicated at step 310. Coupled idle/driven segments are parallel conductors belonging to the respective idle and driven nets in close enough proximity to exchange crosstalk, and the segments are not separated by power or ground layer if they are on different layers. A domain of crosstalk coupling is realized by defining a maximum effective distance between coupled segments, and the audit does not consider contributions from any segment of a driven net separate from that of an idle net by more than this maximum distance. In this example, net 205 in FIG. 2 is simulated as an idle net, and nets 201, 203 and 207 are simulated as driven nets. In particular, analyzer 113 identifies the coupled idle/driven segments such as coupled segments 213 and 214, coupled segments 215 and 216, coupled segments 217 and 218, coupled segments 219 and 216, and coupled segments 218 and 216 which are not nearest neighbors.

After identifying each coupled segment, analyzer 113 provides selected conduction path data associated with the identified segment to crosstalk coefficient generator 115, as indicated at step 315. Also provided to generator 115 is a layer stack-up description including details on the configuration of the layers in the instant PCB, and electrical information about each layer. This electrical information includes (a) the conduction layer type (i.e., whether the layer is used for conducting signals or power, or as ground), (b) the thickness of each conductor layer, (c) the thickness of each dielectric layer between two conductor layers, and (d) the effective dielectric constant of the dielectric layer. The above layer stack-up description may be input by a system user or provided in a PCB design database (not shown) in system 100.

Based on the above inputs, crosstalk coefficient generator 115 generates a crosstalk coefficient for each pair of coupled segments identified by analyzer 113, as indicated at step 320. The crosstalk coefficient represents the maximum level of crosstalk that can be incurred between the coupled segment pair. To that end, generator 115 looks up the coefficient from a coefficient database (not shown) if the current segment pair is configured similarly or identically to a segment pair for which the coefficient was derived by generator 115 before, or otherwise derives the crosstalk coefficient anew, and keeps a copy of the new coefficient and configuration of the current segment pair in the coefficient database for later use. The specific derivation of crosstalk coefficients is fully described hereinbelow.

The coefficients generated by generator 115 are transmitted back to analyzer 113, as indicated at step 323. Based on the received coefficients, analyzer 113 computes, in a well-known manner, near-end crosstalk contributions, $X_{ij}$'s, from segments of driven nets 201, 203 and 207 to idle net 205, as indicated at step 325. Generically, $X_{ij}$ represents the crosstalk contribution to the idle net from the $j^{th}$ segment of the $i^{th}$ driven net. Apart from the crosstalk coefficients, the contribution amounts depend on the voltage swings, rise-times and frequencies of the signals assigned to the driven nets, the coupled lengths of the segments, and the proximity of the coupled segments to the driven nets.

The individual $X_{ij}$ crosstalk contributions to net 205 are accumulated by analyzer 113, also in a well-known manner, to yield a coherent sum (CSum), a coherent/incoherent sum (CISum) and an incoherent sum (ISum), as indicated at step 328. These sums represent three estimates of the aggregate crosstalk effect on net 205 resulting from the contributions. Specifically, the CSum is computed as:

$$CSum = \sum_{i,j} X_{ij}.$$

The ISum is computed as:

$$ISUM = \sqrt{\sum_{i,j} X_{ij}^2}.$$

The CISum is computed as:

$$CISum = \sqrt{\sum_i \left(\sum_j X_{ij}\right)^2}.$$

The CSum is the worst case estimate of the crosstalk effect, with the assumption that the signals of all the contributing driven nets are in phase. The ISum is the best case estimate, with the assumption that the phases of the signals of all the contributing nets are randomly distributed. The CISum is an intermediate case estimate and thus, in general, ISum≦CISum≦CSum. In addition, the CSum, CISum and ISum include crosstalk contributions from all bussed nets and paired nets specified to analyzer 113.

As indicated at step 329, the computation results of $X_{ij}$'s, CSum, CISum and ISum are forwarded by analyzer 113 to crosstalk threshold comparator 117. The latter compares (a) each received $X_{ij}$ with a predetermined acceptable contribution limit, and (b) a selected one of the CSum, CISum and ISum with a predetermined sum corresponding thereto, as indicated at step 330 in FIG. 3B. The particular sum for comparison is selected by a system user based on the validity of its underlying assumption as stated above. In general, CSum is selected if the number of coupled segments is small; ISum is selected if the number of the coupled segments is large; and CISum is selected if the number of segments is medium. In any event, if none of any $X_{ij}$ and the selected sum exceeds the corresponding limit, comparator 117 at step 335 indicates an acceptable crosstalk condition to crosstalk reduction information provider 119. The latter then checks index k and determines whether it equals one, as indicated at step 338. If k=1, provider 119 at step 340 signals to router 105 via feedback path 130 to allow it to proceed to the next stage of the routing. The steps following the condition k≠1 are described hereinbelow.

If it is determined at step 330 that any $X_{ij}$ exceeds the acceptable contribution limit, or the selected sum exceeds the corresponding acceptable sum limit, or both, comparator at step 345 communicates to provider 119 an unacceptable crosstalk condition, the values of the acceptable crosstalk limits and which crosstalk limit or limits have been exceeded. In response to the unsatisfactory indication, provider 119 at step 350 fetches from analyzer 113 selected conduction path data on the coupled segments currently under audit, and the $X_{ij}$ contributions associated therewith. In addition, provider 119 fetches from the coefficient database of generator 115 ethe crosstalk coefficients associated with the coupled segment pairs, as indicated at step 355. These unacceptable crosstalk condition, $X_{ij}$ values and crosstalk coefficients will be fed back to router 105 at a later step to cause the router to reroute the interconnections of FIG. 2, in accordance with a standard routing algorithm in the router.

However, in accordance with an aspect of the invention, in addition to the above data to be fed back to router 105, provider 119 also provides the router with a suggestive redesign of the interconnections of FIG. 2 to help reduce the crosstalk. Provider 119 is in possession of, among others, information on coupled segments in the interconnections in question, which includes individual coupled segment lengths and widths, the amount of separation between coupled segments, and the identities of the layers and nets to which the coupled segments belong. In redesigning the interconnections at step 360, provider 119 identifies any substandard coupled segments, and reconfigure them to reduce the crosstalk.

Figure 4:
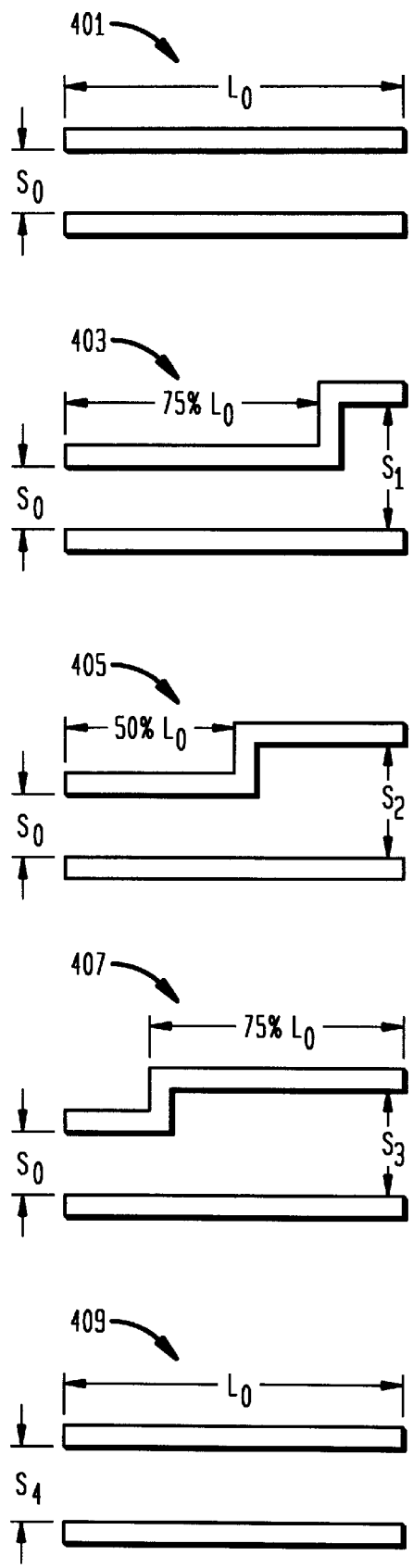
FIG. 4 illustrates coupled segments in alternative configurations for reducing crosstalk in accordance with the invention.

FIG. 4 illustrates possible options considered by provider 119 in the reconfiguration of coupled segment pair 401, corresponding to, say, coupled segments 213 and 214 in FIG. 2. Coupled segment pair 401 consists of two parallel conductors with a coupled length $L_0$ and a separation of $S_0$. Depending on how much crosstalk reduction is desired, the redesign options include coupled segment pairs 403, 405, 407 and 409 in an order of decreasing level of crosstalk in the segments. Pair 403 consists of two segments having 75% of the coupled length separated by $S_0$, and the remaining 25% separated by $S_1$, which is larger than $S_0$. Pairs 405 and 407 have their coupled lengths respectively reduced to 50% and 25% with respect to $L_0$. The remaining lengths are separate by $S_2$ and $S_3$, respectively. The actual separations $S_2$ and $S_3$ are determined by provider 119 to satisfy the crosstalk requirements. The option of having the segments separate by $S_4$ in the entire length, as in pair 409, is also available to provider 119, where $S_4 > S_0$.

Figure 5:
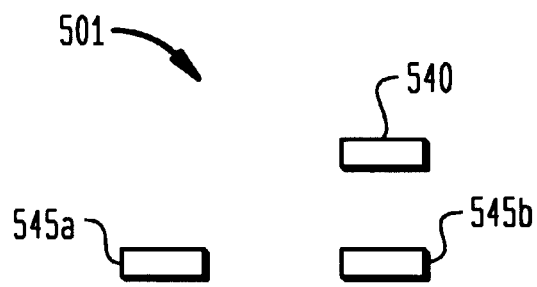
FIG. 5 illustrates alternative dispositions of an unbalanced conductor segment with respect to a pair of balanced conductor segments for reducing crosstalk in accordance with the invention.
Figure 5:
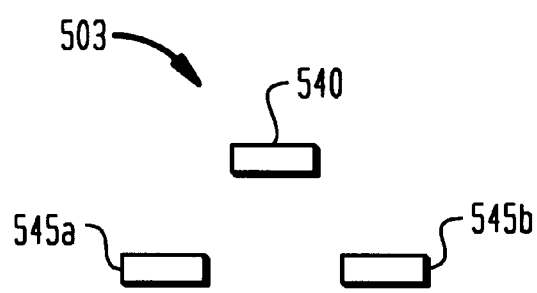
Figure 5:
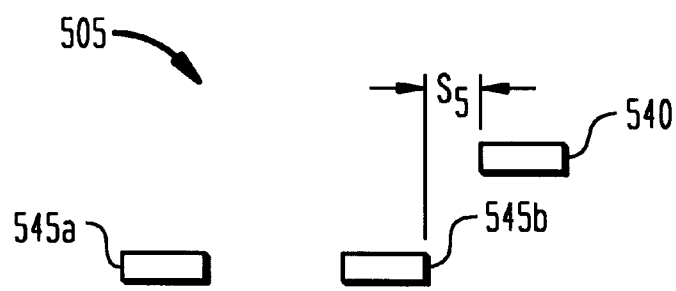

FIG. 5 illustrates a couple of reconfiguration options when provider 119 is faced with arrangement 501 for example, wherein unbalanced conductor segment 540 (shown in cross-section) in a first layer is disposed above balanced conductor segments 545a and 545b (both shown in cross-section) in a second layer.

In implementing balanced conductor segments in general, a signal traverses one of the two conductor segments, and returns on the other segment instead of a ground plane. Thus, both balanced segments have the same switching transients. It is well-known that balanced conductor segments cause minimal crosstalk and radiation, increase noise immunity, and essentially eliminate ground noise when applied to a microstrip or stripline configuration. (A stripline configuration is one having signal conductors sandwiched between two ground planes; and a microstrip configuration is one having signal conductors disposed above a ground plane).

In arrangement 501, unbalanced segment 540 is disposed directly above balanced segment 545b. As an option to reduce the crosstalk, unbalanced segment 540 may be removed to a position between balanced segments 545a and 545b, as in arrangement 503. As another option, unbalanced segment 540 may be moved away from balanced segments 545a and 545b, with a separation of $S_5$ from the closest balanced segment, as in arrangement 505. Provider 119 determines the appropriate value for $S_5$ to meet the crosstalk requirements.

After provider 119 works out a tentative redesign of the interconnections of FIG. 2 which improves the current crosstalk level and probably meets the crosstalk requirements, provider 119 provides the conduction path data on the tentative redesign to crosstalk analyzer 113, as indicated at step 365 in FIG. 3B. To that end, process 300 returns to step 305 after provider 119 at step 370 causes the index k to increase by one. The process then goes through steps 310, 315, 320, 323, 325, 328 and 330 previously described to verify whether the tentative redesign meets the crosstalk requirements. If it is determined at step 330 that it does not, provider 119 needs to work out an improved redesign, which is again audited for crosstalk. This sequence of events is repeated until it is determined at step 330 that the current redesign meets the crosstalk requirements. At that point, k≠1 as verified at step 338. Process 300 proceeds to step 375 where provider 119 communicates to router 105 the above unacceptable crosstalk condition, the $X_{ij}$ values and crosstalk coefficients corresponding to the interconnections of FIG. 2, and the final redesign by provider 119 pursuant to a standard, agreed-upon protocol.

Based on the information from provider 119, router 105, in a conventional manner, reroutes the current or previous connections to reduce the crosstalk, and may adopt the redesign suggested by provider 119 entirely, partially or not at all. After the crosstalk level becomes acceptable, router 105 proceeds to the next stage of the routing. This process continues until the entire PCB is routed. The end product is guaranteed to meet all the crosstalk requirements and ready for manufacture.

The derivation of crosstalk coefficients in crosstalk coefficient generator 115 will now be described. In particular, the derivation of crosstalk coefficients relating to a stripline configuration is disclosed hereinbelow. Since the derivation of crosstalk coefficients relating to a microstrip configuration is well-known, it is omitted here. For such derivation, one may refer to such article as: A. J. Rainal, "Transmission Properties of Balanced Interconnections," *IEEE Transactions on Components, Hybrids, and Manufacturing Technology*, vol. 16, February 1993, pp. 137–145.

In deriving the crosstalk coefficients relating to a stripline configuration, it is assumed that the interconnections behave as lossless transmission lines in a homogeneous medium having a given relative dielectric constant, $\epsilon_r$. It should be noted that the derivation here also applies to electrical interconnections associated with monolithic microwave integrated circuits, and hybrid integrated circuits.

Figure 6:
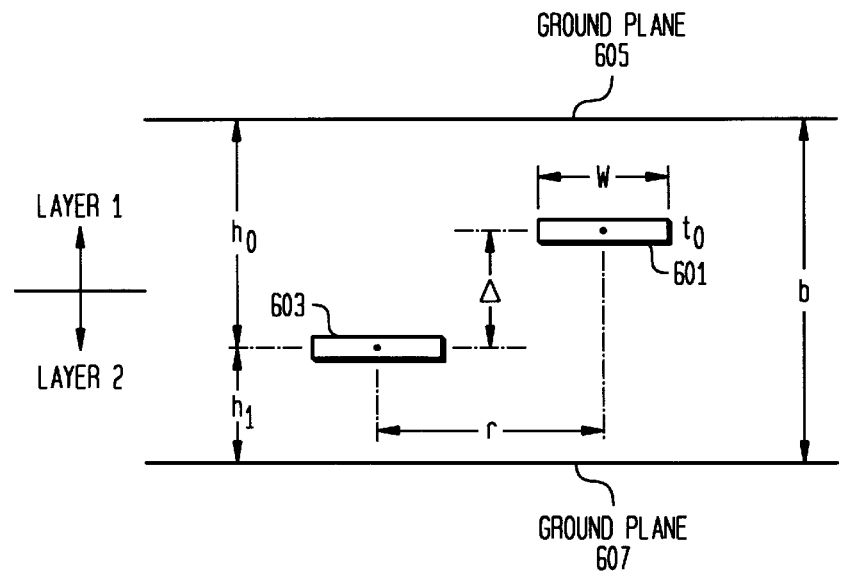
FIG. 6 illustrates two unbalanced conductor segments in a stripline configuration for which a crosstalk coefficient is computed in the routing system of FIG. 1.

FIG. 6 shows a cross-section of two unbalanced, transmission lines (or conductor segments) 601 and 603 in a generic stripline configuration, which are disposed in respective layers 1 and 2. Line 601 is simulated as an idle line while line 603 is simulated as a driven line. The width and thickness of each transmission line is denoted w and $t_0$, respectively. The distances of line 603 with respect to ground plane 605 and ground plane 607 are denoted $h_0$ and $h_1$, respectively. Planes 605 and 607 are separated by a distance denoted b. The center-to-center distance between lines 601 and 603 lengthwise is denoted r, and the center-to-center distance between the lines heightwise is denoted $\Delta$. In practice, two orthogonal signal layers are usually employed as layers 1 and 2 to minimize the interlayer crosstalk, and a power plane may replace one of the two ground planes.

Ground planes 605 and 607 can be modeled, in a well-known manner, with 2n current filaments in a single totem pole arrangement wherein n of the filaments have a current rate $\dot{I}$ and the other n filaments have a current rate $-\dot{I}$, where n is a very large positive integer. It can be shown that the characteristic impedance of unbalanced transmission line 601, $Z_U$, can be approximated as follows:

$$Z_U \doteq \frac{59}{\sqrt{\epsilon_r}} \left\{ \ln\left[\frac{18h_0 h_1}{pb}\right] + \frac{h_0 h_1}{b^2} \right\}, \qquad (1)$$

where $p=2(w+t_0)$ Expression (1) also applies to a pair of circular conductors by setting $p=2\,\rho\,\exp[5/4]$, where $\rho$ represents the radius of the circular conductors. Since n is very large, the coefficient $(U_2 U_1)$ of the near-end, interlayer unbalanced crosstalk from layer 2 to layer 1 can be expressed as follows:

$$U_2 U_1 = \frac{\sum_{n=0}^{\infty} \ln\left\{\left[\frac{r^2 + (2h_0 + 2nb - \Delta)^2}{r^2 + (2nb + \Delta)^2}\right]\left[\frac{r^2 + (2h_1 + 2nb + \Delta)^2}{r^2 + (2b + 2nb - \Delta)^2}\right]\right\}}{4\left\{\ln\left[\frac{18h_0 h_1}{pb}\right] + \frac{h_0 h_1}{b^2}\right\}}. \qquad (2)$$

Figure 7:
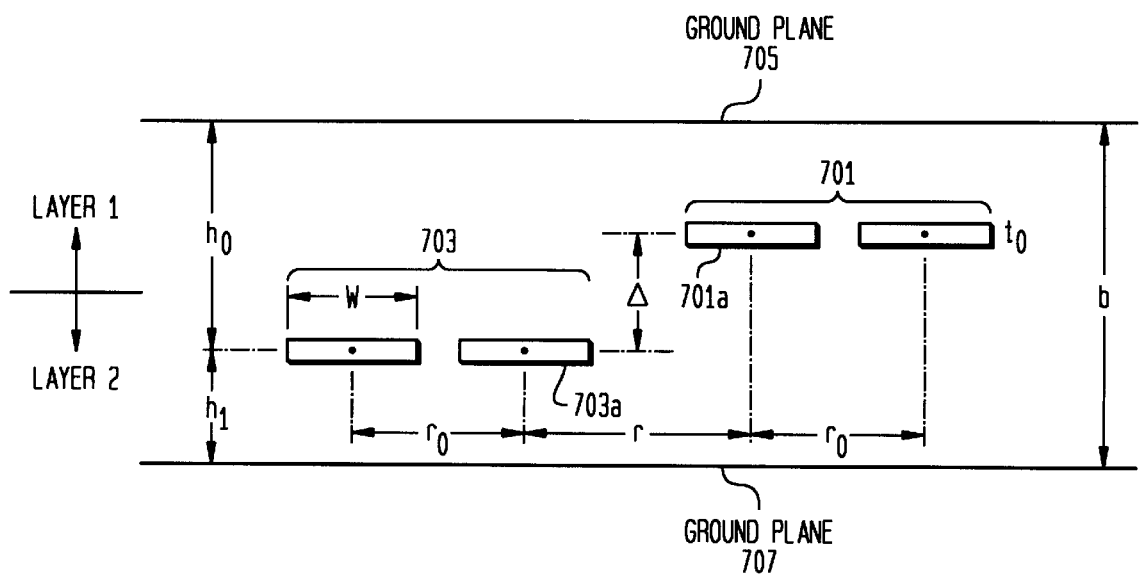
FIG. 7 illustrates two pairs of balanced conductor segments in a stripline configuration for which a crosstalk coefficient is computed in the routing system of FIG. 1.

FIG. 7 shows a cross-section of two pairs of balanced transmission lines in a generic strip line configuration, which are disposed in respective layers 1 and 2. Similarly, balanced transmission line pair 701 is simulated as an idle pair while balanced transmission line pair 703 is simulated as a driven pair. The width and thickness of each transmission line in FIG. 7 is denoted w and $t_0$, respectively. The distances of line pair 703 from ground planes 705 and 707 are denoted $h_0$ and $h_1$, respectively. The ground planes are separated by a distance denoted b. However, the center-to-center distance between the two transmission lines in each pair is denoted $r_0$. The center-to-center distance between transmission line 703a and transmission line 701a lengthwise is denoted r. The center-to-center distance between these two transmission lines heightwise is denoted $\Delta$. Again, in practice two orthogonal signal layers are usually employed as layers 1 and 2 to minimize the interlayer crosstalk, and a power plane may replace one of the two ground planes.

Ground planes 705 and 707 can be modeled, in a conventional manner, with 4n current filaments in a double totem pole arrangement wherein 2n of the filaments have a current rate $\dot{I}$ and the other 2n filaments have a current rate $-\dot{I}$, where n is a very large positive integer. It can be shown that the characteristic impedance of balanced transmission line 701a, $Z_B$, can be expressed as follows:

$$Z_B = \qquad (3)$$

$$\frac{120}{1.016\sqrt{\epsilon_r}} \left\{ \ln\left[\frac{2e^{3/2}(r_0/p)[1+[r_0/2b]^2]}{[[1+[r_0/2h_0]^2][1+[r_0/2h_1]^2]]^{1/2}}\right] + \right.$$

$$\left. (1/2)\sum_{n=1}^{\infty} \ln\left[\frac{\left[1+\left[\frac{r_0}{2b+4nh_0}\right]^2\right]\left[1+\left[\frac{r_0}{2b+4nh_1}\right]^2\right]}{\left[1+\left[\frac{r_0}{2b+(4n-2)h_0}\right]^2\right]\left[1+\left[\frac{r_0}{2b+(4n-2)h_1}\right]^2\right]}\right]\right\}.$$

With expressions (1), (2) and (3), the following stripline crosstalk identities are defined. Referring briefly to FIG. 6, by reciprocity, where $Z_{Up}$ denotes the characteristic impedance of an unbalanced transmission line in layer p, and can be determined using expression (1). $U_2 U_1$ can be determined using expression (2). In addition, $$U'_1 B_2 = U_1 U_2 |_r - U_1 U_2 |_{r+r_0} = [U_2 U_1 |_r - U_2 U_1 |_{r+r_0}]\left[\frac{Z_{U2}}{Z_{U1}}\right], \qquad (5)$$

where $U'_1 B_2$ is a crosstalk coefficient representing a "unbalanced to balanced" near-end, interlayer crosstalk voltage ratio normalized (indicated with "'") with respect to an unbalanced drive signal, as discussed in the Rainal article above. By reciprocity, $$B'_2 U_1 = [U'_1 B_2]\left[\frac{Z_{U1}}{Z_{B2}}\right], \qquad (6)$$

where $Z_{Bp}$ denotes the characteristic impedance of a balanced transmission line in layer p. In addition, $$U'_2 B_1 = U_2 U_1|_r - U_2 U_1|_{r+r_0}. \qquad (7)$$

By reciprocity, $$B'_1 U_2 = [U'_2 B_1]\left[\frac{Z_{U2}}{Z_{B1}}\right]. \qquad (8)$$

It also can be shown that:

$$B_1 B_2 = [2U_2 U_1 |_{r+r_0} - U_2 U_1 |_{r+2r_0} - U_2 U_1 |_r]\left[\frac{Z_{U2}}{Z_{B1}}\right], \qquad (9)$$

where $B_1B_2$ represents the coefficient of the near-end, interlayer balanced crosstalk from layer 2 to layer 1 in FIG. 7. By reciprocity, $$B_2B_1 = [B_1B_2]\left[\frac{Z_{B1}}{Z_{B2}}\right]. \tag{10}$$

The foregoing merely illustrates the principles of the invention. It will thus be appreciated that those skilled in the art will be able to devise numerous other routing systems which embody the principles of the invention and are thus within its spirit and scope.

For example, in the disclosed system, when interconnections by router 105 do not meet the crosstalk requirements, crosstalk reduction information provider 119 feeds back to router 105 information more than the fact that the crosstalk level is unacceptable. Thus, it will be appreciated that a person skilled in the art may cause the information provider, under the same situation, to communicate only the unacceptable crosstalk condition to the router, or simply represent to the router that the space for all or a portion of the segments in the interconnections is occupied. In either case, the router has to rely solely on its own routing algorithm to modify the connections to satisfy the crosstalk requirements.

Finally, although the disclosed routing system is embodied in the form of various discrete electronic blocks and components, the invention could equally well be embodied in a system in which the functions of any one or more of those blocks and components or indeed, all of the functions thereof, are realized, for example, by one or more appropriately programmed processors.

We claim:

1. Apparatus for use with a router operable for placement of a set of conduction paths to interconnect circuit components, comprising:

a processor for determining whether a level of crosstalk in the conduction paths in the set exceeds a predetermined crosstalk limit;

a controller for generating a signal to operate said router, said signal representing at least information indicative of a determination by said processor; and a redesign provider for providing a reconfiguration of the set of conduction paths when the level of crosstalk exceeds the predetermined crosstalk limit, the processor re-determining whether the level of crosstalk in the conduction paths in the set corresponding to the reconfiguration exceeds the predetermined crosstalk limit, the at least information including information concerning the reconfiguration when the level of crosstalk in the conduction paths in the set corresponding to the reconfiguration does not exceed the predetermined crosstalk limit, the controller causing the router to effect placement of the set of conduction paths currently determined to have a level of crosstalk not greater than the predetermined crosstalk limit, the reconfiguration including a selected reconfiguration of at least one subset of the conduction paths including a pair of balanced transmission lines and an unbalanced transmission line, the balanced transmission line pair exchanging crosstalk with said unbalanced transmission line, the level of crosstalk being a function of a position of said unbalanced transmission line relative to the balanced transmission line pair, the selected reconfiguration involving a change in said position.

2. A system for designing a layout of a circuit comprising:

a router for routing a set of conduction paths in said layout;

a processor for comparing a level of crosstalk in said conduction paths in the set with a predetermined crosstalk limit; and a redesign provider for providing a reconfiguration of the set of conduction paths to reduce crosstalk when said level of crosstalk exceeds said predetermined crosstalk limit, the processor re-comparing the level of crosstalk in the conduction paths in the set corresponding to the reconfiguration with the predetermined crosstalk limit, the provider transmitting information concerning the reconfiguration to the router when the level of crosstalk in the conduction paths in the set corresponding to the reconfiguration does not exceed the predetermined crosstalk limit, the router effecting placement of the conduction paths in the set corresponding to the reconfiguration in the layout in response to the information, said processor including means for defining a plurality of conduction nets from said conduction paths, and means for selecting said conduction nets one by one for a crosstalk evaluation, each selected conduction net being simulated as in an idle condition and other conduction nets being simulated as in a driven condition, said crosstalk evaluation including a derivation of crosstalk contributions from the driven conduction nets to the idle conduction net.

3. The system of claim 2 wherein said processor further includes means for accumulating said crosstalk contributions, said level of crosstalk being a function of an accumulation of said crosstalk contributions.

4. The system of claim 2 wherein a first path segment in said idle conduction net exchanges crosstalk with a second path segment in one of said driven conduction nets, the level of crosstalk being a function of a separation between the first and second path segments, said reconfiguration including a change in said separation.

5. The system of claim 2 wherein a first pair of path segments in said idle conduction net exchanges crosstalk with a second pair of path segments in one of said driven conduction net, the level of crosstalk being a function of a separation between said pairs, said reconfiguration including a change in said separation.

6. The system of claim 5 wherein at least one of said first and second pairs of path segments comprises a couple of balanced transmission lines.

7. The system of claim 2 wherein an unbalanced transmission line in said idle conduction net exchanges crosstalk with a pair of balanced transmission lines in one of said driven conduction nets, the level of crosstalk being a function of a position of said unbalanced transmission line relative to the balanced transmission line pair, said reconfiguration including a change in said position.

8. The system of claim 2 wherein said conduction paths are routed on a PWB.

9. A method for placing by a router a set of conduction paths to interconnect circuit components comprising the steps of:

determining whether a level of crosstalk in the conduction paths in the set exceeds a predetermined crosstalk limit;

generating a signal to operate said router, said signal representing at least information indicative of a determination by the determining step;

providing a reconfiguration of the set of conduction paths when the level of crosstalk exceeds the predetermined crosstalk limit;

re-determining whether the level of crosstalk in the conduction paths in the set corresponding to the reconfiguration exceeds the predetermined crosstalk limit, the at least information including information concerning the reconfiguration when the level of crosstalk in the conduction paths in the set corresponding to the reconfiguration does not exceed the predetermined crosstalk limit; and causing the router to effect placement of the set of conduction paths currently determined to have a level of crosstalk not greater than the predetermined crosstalk limit, the reconfiguration including a selected reconfiguration of at least one subset of the conduction paths including a pair of balanced transmission lines and an unbalanced transmission line, the balanced transmission line pair exchanging crosstalk with said unbalanced transmission line, the level of crosstalk being a function of a position of said unbalanced transmission line relative to the balanced transmission line pair, the selected reconfiguration involving a change in said position.

10. A method for designing a layout of a circuit comprising the steps of:

routing by a router a set of conduction paths in said layout;

comparing a level of crosstalk in the conduction paths in the set with a predetermined crosstalk limit;

providing a reconfiguration of the set of conduction paths to reduce crosstalk when said level of crosstalk exceeds said predetermined crosstalk limit;

re-comparing the level of crosstalk in the conduction paths in the set corresponding to the reconfiguration with the predetermined crosstalk limit;

transmitting information concerning the reconfiguration to the router when the level of crosstalk in the conduction paths in the set corresponding to the reconfiguration does not exceed the predetermined crosstalk limit; and effecting placement by the router of the conduction paths in the set corresponding to the reconfiguration in the layout in response to the information, the comparing step including the steps of defining a plurality of conduction nets from said conduction paths, and selecting said conduction nets one by one for a crosstalk evaluation, each selected conduction net being simulated as in an idle condition and other conduction nets being simulated as in a driven condition, said crosstalk evaluation including a derivation of crosstalk contributions from the driven conduction nets to the idle conduction net.

11. The method of claim 10 wherein the comparing step further includes the step of accumulating said crosstalk contributions, said level of crosstalk being a function of an accumulation of said crosstalk contributions.

12. The method of claim 10 wherein a first path segment in said idle conduction net exchanges crosstalk with a second path segment in one of said driven conduction nets, the level of crosstalk being a function of a separation between the first and second path segments, said reconfiguration including a change in said separation.

13. The method of claim 10 wherein a first pair of path segments in said idle conduction net exchanges crosstalk with a second pair of path segments in one of said driven conduction net, the level of crosstalk being a function of a separation between said pairs, said reconfiguration including a change in said separation.

14. The method of claim 13 wherein at least one of said first and second pairs of path segments comprises a couple of balanced transmission lines.

15. The method of claim 10 wherein an unbalanced transmission line in said idle conduction net exchanges crosstalk with a pair of balanced transmission lines in one of said driven conduction nets, the level of crosstalk being a function of a position of said unbalanced transmission line relative to the balanced transmission line pair, said reconfiguration including a change in said position.

* * * * *